United States Patent [19]

Reynolds

[11] Patent Number: 5,285,173
[45] Date of Patent: Feb. 8, 1994

[54] SIGNAL-CONTROLLED RING OSCILLATOR WITH DELAY CELLS HAVING CONSTANT GAIN WITH CHANGE IN FREQUENCY

[75] Inventor: David C. Reynolds, Georgetown, Mass.

[73] Assignee: Analog Devices, Inc., Norwood, Mass.

[21] Appl. No.: 912,550

[22] Filed: Jul. 13, 1992

[51] Int. Cl.⁵ .................. H03B 5/00; H03K 3/354
[52] U.S. Cl. .................. 331/57; 331/108 B; 331/177 R
[58] Field of Search .............. 331/57, 108 A, 108 B, 331/177 R

[56] References Cited

U.S. PATENT DOCUMENTS

| | | |
|---|---|---|
| 4,876,519 | 10/1989 | Davis et al. ............... 331/57 |
| 4,893,095 | 1/1990 | Thommen .................. 331/57 |
| 5,061,907 | 10/1991 | Rasmussen ............... 331/57 |
| 5,206,609 | 4/1993 | Mijuskovic ................. 331/57 |

*Primary Examiner*—Siegfried H. Grimm
*Attorney, Agent, or Firm*—Parmelee, Bollinger & Bramblett

[57] ABSTRACT

A ring-type oscillator with a plurality of delay cells including differential pairs of MOS transistors. Current sources supply current to each pair, and the magnitude of the current supplied is variable by a control voltage to alter the delay of the MOS devices, thereby to alter the frequency of oscillation. Each delay cell MOS device is connected in series with another MOS device biased into its linear region to act as a load resistance. This load is variable by the control voltage so as to tend to maintain the gain of the delay cells constant with changes in frequency of oscillation.

10 Claims, 1 Drawing Sheet

SIGNAL-CONTROLLED RING OSCILLATOR WITH DELAY CELLS HAVING CONSTANT GAIN WITH CHANGE IN FREQUENCY

BACKGROUND OF THE INVENTION

1. Field of the Invention

This invention relates to oscillators of the type having a number of delay cells interconnected in a closed ring configuration. More particularly, this invention relates to such oscillators wherein the delay is controllable by a signal so as to vary the frequency of oscillation.

2. Description of the Prior Art

Ring oscillators have been used for many years. Modern designs have used MOS inverters as delay cells, and the delay has been controlled by setting the flow of current through the inverter. Commonly, each inverter comprises a series-connected pair of complementary MOS devices, with the current therethrough being produced by a current source controlled by an input signal.

One of the problems with such prior art ring oscillators is that the gain of the inverters varies with the level of current through the inverter as the oscillator input signal changes. This gain variability may cause the oscillator to stop if the gain drops too low, or may cause associated circuitry such as a phase lock loop to become unstable if the gain becomes too high. Another problem is that prior art oscillators of this type typically develop relatively large oscillatory voltage swings so that the oscillator frequency would be undesirably low due to the time required to charge up and discharge the parasitic capacitances associated with the MOS devices.

SUMMARY OF THE INVENTION

In a preferred embodiment of the invention, to be described hereinbelow in detail, there is provided a ring-type signal-controlled oscillator comprising a series of delay elements in the form of differential pairs of MOS transistors. These transistors are provided with loads comprising respective MOS transistors. Each differential pair is supplied with current from a respective current source controlled by the oscillator input signal, so that the delay of the cells is responsive to the input signal level. The inputs and outputs of the differential pair transistors are interconnected in a closed ring to produce oscillations at a frequency determined by the cell delay.

The MOS transistors serving as loads for the inverters are also controlled by the input signal. The arrangement is such that as the inverter current goes up in response to a change in the input signal, the load resistance goes down in response to that same change in input signal. Increased inverter current causes an increase in $g_m$ in the MOS devices of the inverter; however, the overall gain tends to stay constant because the load resistance goes down at the same time. That is, in the relationship: Gain=$g_m R_L$, the two factors in the right-hand side of the equation will vary inversely, thereby tending to maintain the gain constant.

The embodiment to be described also is provided with a control circuit arranged to insure that the voltage swings of oscillation are relatively small, and independent of bias level. Such small oscillations improve the maximum operating frequency of the oscillator by limiting the amount of time spent charging and discharging the parasitic capacitances at the outputs of the delay cells. The differential configuration of the delay cells provides excellent noise immunity, thus ensuring low jitter, and affords a degree of immunity from power supply variations.

Other objects, aspects and advantages of the invention will be pointed out in, or apparent from, the following description of a preferred embodiment, considered together with the single drawing sheet.

DESCRIPTION OF THE PREFERRED EMBODIMENT

Figure 1:
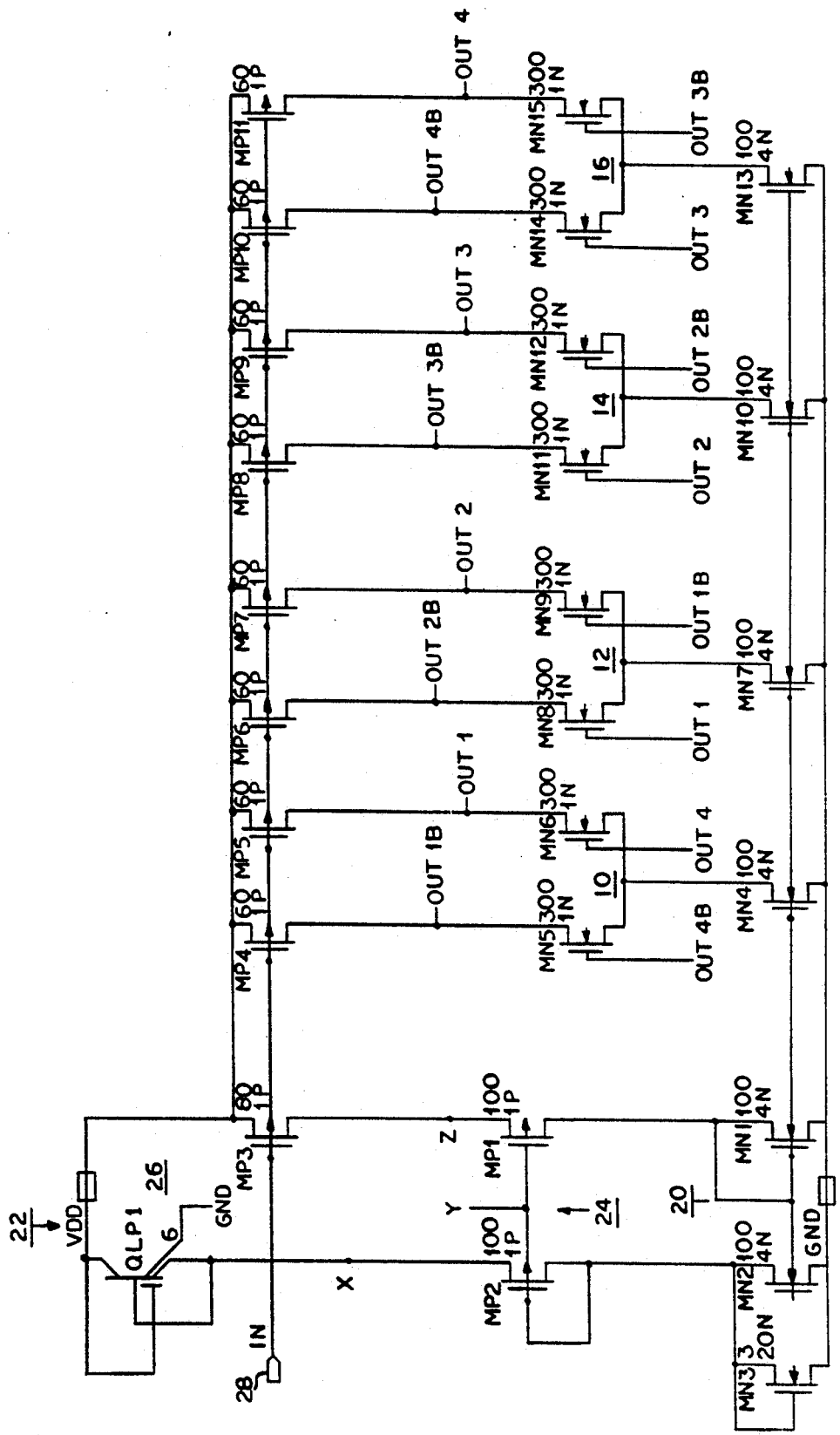
FIG. 1 is a schematic diagram showing the circuit arrangement of a preferred embodiment of the invention.

Referring first to the central region of the drawing, the oscillator comprises four delay cells 10, 12, 14 and 16 in the form of differential pairs of MOS transistors. The output of each transistor is connected to the gate of another of the oscillator transistors, as indicated by the identifying labels on the output and gates. For example, the output 4B of the left-hand transistor MN14 of the fourth pair 16 is connected to the gate of the left-hand transistor MN5 of the first pair 10, and so on. This arrangement connects all of the transistors in ring configuration, effecting closed-loop feedback to produce oscillations through all of the transistors. These oscillations are of square-wave form, with the transistors acting effectively as switches.

Each pair of transistors 10-16 is supplied with current by a corresponding current source MN4, MN7, MN10 and MN13. The gates of these current source transistors are connected together and to the gates of a pair of transistors MN1, MN2 arranged as a current mirror 20 which sets the bias level of the sources MN4, etc., and forms part of the bias circuitry generally indicated at 22. The current mirror 20 is connected through another current mirror 24 (MP1, MP2) to a control circuit 26 which includes an MOS transistor MP3. The gate of this transistor receives the oscillator input signal, i.e., the signal for setting the frequency of oscillation, which is applied as a voltage to an input terminal 28. This transistor (MP3) produces a corresponding input current.

The gate of the transistor MP3 is connected to the gates of a series of like transistors MP4, etc., which are connected in series with the MOS devices of the differential pairs 10-16. The transistors MP4, etc., serve as voltage-controlled resistive loads for the corresponding MOS devices, as will be explained.

The bias circuitry 22 includes a transistor QLP1 comprising a parasitic lateral PNP formed from a PMOS device in an N-well CMOS circuit. The voltage at point "X" in the bias circuitry will be $VDD - V_{BE}$, where $V_{BE}$ is the base-to-emitter voltage of the bipolar junction of QLP1. The voltage at the commonly-connected gates of MP1, MP2 (point "Y") will be $VDD - V_{BE} - V_{gs}$. Thus the voltage at point "Z" will be $VDD - V_{BE}$. That is, the voltage at "Z" will be equal to that at "X", since $V_{gs}$ for both MP1 and MP2 are equal.

Accordingly, the current mirror 24 forces the source-to-drain voltage of MP3 to be maintained at the $V_{BE}$ of the junction of QLP1 (about 0.7 volts). Since $V_{gs}$ for this transistor will be relatively large (about 2-2.5 volts), MP4 will be biased into its linear region. The same is true for MP4, MP5, etc., so that those transistors can serve as voltage-controlled loads for the delay cell transistors.

If the voltage at the input terminal 28 decreases, the gate-to-source voltage ($V_{gs}$) of MP3 will increase as will the current through that transistor. This increase is reflected through the double-facing current mirrors 20, 24 to produce a corresponding increase in the current of the sources MN4, MN7, etc., supplying the differential pairs of inverters 10–16. This increase in inverter current decreases the delay of each cell and thereby increases the frequency of oscillation.

As the inverter current goes up, the $g_m$ of the MOS devices goes up correspondingly. However, the decrease in input signal which produced that increase in $g_m$ also decreases the resistance of the loads MP4, MP5, etc., so as to tend to maintain the overall gain constant by virtue of the relationship: Gain = $g_m R_L$. The "IR" drop across the load is nearly constant, with the decrease in $R_L$ being balanced by the increase in I. Thus the gain is essentially unaffected by the changes in bias current through the inverters.

The $V_{BE}$ voltage across MP3 constrains the voltage swings of the oscillator, and affords desirable headroom for the circuit. With a 5 volt supply, for example, the headroom will be 5–0.7, or about 4.3 volts. Use of the $V_{BE}$ voltage for this purpose is also advantageous because it is stable, readily produced, and effectively invariant with normal current changes.

Accordingly, it will be seen that the invention makes possible a ring-type CMOS oscillator capable of stable, high speed operation with wide dynamic range and low jitter. Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. A signal-controlled oscillator comprising:
   a plurality of delay cells each having an input and an output;
   means connecting said delay cells in a ring configuration to produce oscillations at a frequency determined by the delay of said cells;
   said delay cells comprising means responsive to current flow therethrough to vary the delay with changes in current;
   a plurality of current source means supplying current to said delay cells respectively and responsive to a first control signal for setting the level of current through said delay cells;
   a plurality of load means comprising MOS devices in series with said delay cells respectively and responsive to a second control signal for setting the magnitude of load;
   bias means to provide operation of said MOS devices in their linear region; and
   circuit means responsive to an input signal for developing said first and second control signals to vary each cell delay while correspondingly altering the load so as to tend to maintain the overall gain constant.

2. An oscillator as claimed in claim 1, wherein said delay cells comprise differential pairs of MOS devices.

3. An oscillator as claimed in claim 2, wherein said current source means comprise one MOS device for each differential pair.

4. An oscillator as claimed in claim 1, wherein said delay cells comprise differential pairs of MOS devices interconnected to provide that when one device is turned on, the other is turned off.

5. An oscillator as claimed in claim 4, wherein said load means comprise MOS devices for each MOS device of said differential pairs.

6. An oscillator as claimed in claim 1, wherein said bias means comprises a bipolar transistor; and
   means developing source-to-drain voltages for said load MOS devices corresponding to the $V_{BE}$ of a junction of said bipolar transistor.

7. An oscillator as claimed in claim 1, including means for producing an input current corresponding to said input signal;
   current-mirror means responsive to said input current; and
   means under the control of said current-mirror means for setting the current of said current source means to correspond to said input current.

8. An oscillator as claimed in claim 7, wherein said load means comprise MOS devices;
   said means for producing an input current comprising an input MOS device;
   means for establishing a regulated source-to-drain voltage of low magnitude at said input MOS device; and
   means coupling said input MOS device to said MOS load devices to operate those devices in their linear region and to control the resistances thereof in accordance with said input signal.

9. A signal-controlled oscillator comprising:
   a plurality of delay cells each having an input and an output;
   said delay cells comprising differential pairs of MOS devices;
   means connecting said MOS devices in a ring configuration to produce oscillations at a frequency determined by the delay of said MOS devices;
   said MOS devices being responsive to current flow therethrough to vary the delay with changes in current;
   a plurality of current sources each supplying current to one of said differential pairs of MOS devices;
   said current sources being responsive to a control signal for setting the level of current through said MOS devices;
   circuit means responsive to an input signal for developing said control signal to vary the delay of each MOS device to set the frequency of oscillation; and
   controllable loads in series with each of said MOS devices;
   said loads being responsive to a second control signal developed by said input signal to provide that the gain of each delay cell is maintained effectively constant with changes in frequency of oscillation as determined by said input signal.

10. A signal-controlled oscillator comprising:
    a plurality of delay cells each having an input and an output;
    means connecting said delay cells in a ring configuration to produce oscillations at a frequency determined by the delay of said cells;
    said delay cells comprising means responsive to current flow therethrough to vary the delay inversely with changes in current;
    a plurality of current source means supplying current to said delay cells respectively and responsive to a first control signal for setting the level of current through said delay cells;

a plurality of load means in series with said delay cells respectively and responsive to a second control signal for setting the magnitude of load;

said load means comprising MOS devices;

said MOS devices having common current-carrying electrodes connected to a supply line; the gates of said MOS devices being connected together; and circuit means for developing a bias voltage between said supply line and said connected gates;

said circuit means comprising a parasitic bipolar diode element formable in the MOS process used for said MOS devices and arranged to limit said bias voltage to a diode voltage drop.

* * * * *